US006246290B1

(12) United States Patent
Morrish et al.

(10) Patent No.: US 6,246,290 B1
(45) Date of Patent: Jun. 12, 2001

(54) HIGH GAIN, CURRENT DRIVEN, HIGH FREQUENCY AMPLIFIER

(75) Inventors: Andrew Morrish, Saratoga; Thomas Mills, Sunnyvale, both of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/429,144

(22) Filed: Oct. 28, 1999

(51) Int. Cl.$^7$ ........................................ H03F 3/04
(52) U.S. Cl. ........................................ 330/311; 330/98
(58) Field of Search ........................................ 330/98, 99, 100, 330/252, 311

(56) References Cited

U.S. PATENT DOCUMENTS 4,218,659 * 8/1980 Arai ........................................ 330/6
5,045,808 * 9/1991 Taylor ........................................ 330/277
5,530,405 * 6/1996 Rydel ........................................ 330/278

* cited by examiner

*Primary Examiner*—Benny Lee
*Assistant Examiner*—Henry Choe
(74) *Attorney, Agent, or Firm*—Baker & McKenzie

(57) ABSTRACT

A high gain, current driven amplifier uses an emitter follower circuit with another emitter follower circuit connected in a feedback configuration to drive a common base amplifier circuit in place of a conventional cascode amplifier configuration to achieve a high frequency response with adequate signal gain. A differential input signal can be used, thereby minimizing input DC offsets, drift and noise, by using a differential amplifier to convert a differential input signal voltage to the input signal current for driving the emitter follower circuits. The current gain is determined by a ratio of the resistances in the emitter circuits of the emitter follower circuits. In one embodiment, the currents formed in the emitter follower circuits are summed at the input to the common base amplifier circuit, while in another embodiment, such currents are summed at the output of the common base amplifier circuit.

17 Claims, 3 Drawing Sheets

HIGH GAIN, CURRENT DRIVEN, HIGH FREQUENCY AMPLIFIER

BACKGROUND OF THE INVENTION

1. Field of the Invention

The present invention relates to high frequency amplifier circuits, and in particular, to high frequency amplifier circuits driven by a current signal source and providing high current gain.

2. Description of the Related Art

Referring to FIG. 1, cascode amplifiers (i.e., transistor Q2, driving by transistor Q1, in turn, drives transistor Q3 in a cascode configuration) are often used for video amplifier designs due to their ability to provide a high frequency signal response while also providing a moderate amount of voltage gain. For example, in a typical open loop cathode ray tube (CRT) video driver application, a cascode pair (transistors Q2 and Q3) can be driven by an emitter follower circuit (transistor Q1 and resistor R1) to create an amplifier with a high input impedance and a voltage gain in the range of 10–15.

However, some applications require significantly higher signal gains. In such applications, it is also sometimes necessary to operate with a differential input signal so as to minimize DC offsets, drift and noise. In still other applications, it may further be desirable for such a high bandwidth amplifier to receive its input signal in the form of a current signal.

SUMMARY OF THE INVENTION

A high gain, current driven amplifier uses an emitter follower circuit with another emitter follower circuit connected in a feedback configuration to drive a common base amplifier circuit in place of a conventional cascode amplifier configuration to achieve a high frequency response with adequate signal gain. A differential input signal can be used, thereby minimizing input DC offsets, drift and noise, by using a differential amplifier to convert a differential input signal voltage to the input signal current for driving the emitter follower circuits. The current gain is determined by a ratio of the resistances in the emitter circuits of the emitter follower circuits.

In accordance with one embodiment of the present invention, a current driven amplifier includes amplifier input and output terminals and voltage follower amplifier circuits. The amplifier input terminal is configured to convey an amplifier input current, while the amplifier output terminal is configured to convey an amplifier output current which is a multiple of the amplifier input current. A first voltage follower amplifier circuit includes a first bias terminal, a first input terminal coupled to the amplifier input terminal, and a first output terminal coupled to the amplifier output terminal, and is configured to provide a first portion of the amplifier output current. A second voltage follower amplifier circuit includes a second bias terminal, a second input terminal coupled to the amplifier output terminal, and a second output terminal coupled to the amplifier input terminal, and is configured to receive a portion of the amplifier input current and provide a second portion of the amplifier output current.

In accordance with another embodiment of the present invention, a current driven amplifier includes input and output terminals, two transistors and two resistors. The input terminal is configured to convey an input current, while the output terminal is configured to convey an output current which is a multiple of the input current. The first transistor includes a first base terminal coupled to the input terminal, a first emitter terminal and a first collector terminal. The second transistor includes a second base terminal coupled to the output terminal, a second emitter terminal and a second collector terminal. The first resistor is coupled between the first emitter terminal and the output terminal. The second resistor is coupled between the second emitter terminal and the input terminal.

These and other features and advantages of the present invention will be understood upon consideration of the following detailed description of the invention and the accompanying drawings.

DETAILED DESCRIPTION OF THE INVENTION

Figure 1:
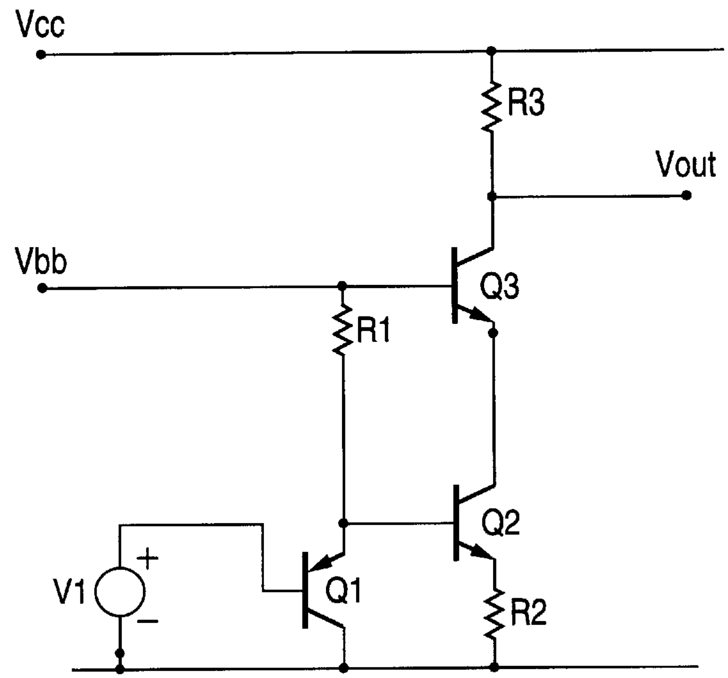
FIG. 1 is a schematic diagram of a conventional cascode amplifier circuit suitable for use as a video amplifier.
Figure 2:
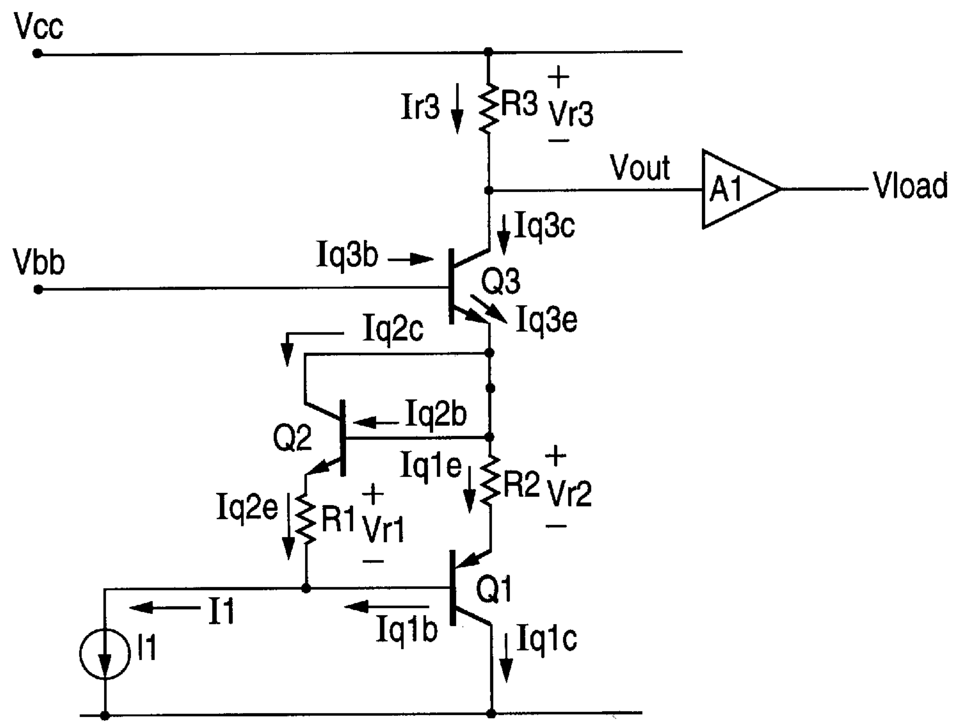
FIG. 2 is a schematic diagram of a current driven amplifier circuit in accordance with one embodiment of the present invention.

Referring to FIG. 2, a current driven amplifier circuit in accordance with one embodiment of the present invention provides a high gain amplifier with a high frequency signal response that can be used in place of a conventional cascode amplifier circuit. Unlike the cascode circuit of FIG. 1, this amplifier circuit is driven by a current signal source I1. This input signal current I1 flows almost entirely through resistor R1 as the emitter current Iq2e of transistor Q2 (assuming that the base current Iq1b of transistor Q1 is negligible due to the typically high current gain $\beta$ of transistor Q1). Thus, transistor Q1 acts as a voltage follower with a diode offset. (Transistor Q2, with its base and collector terminals connected together, is configured to act as a diode. Transistors Q1 and Q2, along with their respective emitter resistors R2 and R1, are connected as voltage follower circuits in the form of emitter follower circuits, with transistor Q2 and resistor R1 connected in a feedback arrangement with respect to transistor Q1 and resistor R2.) Due to the cancellation effect of the substantially equal base-emitter diode voltage drops for transistors Q1 and Q2, the differential voltage Vr2 developed across resistor R2 is equal to the voltage Vr1 developed across resistor R1.

Resistor R1 would generally be selected to be significantly lower in value than resistor R2, although not so low as to cause a significant base current Iq1b to flow from transistor Q1 (due to the concomitant increased voltages Vr1, Vr2 across resistors R1 and R2 and, therefore, increased emitter Iq1e and base Iq1b currents in transistor Q1.) As a result, the total current flowing through the emitter of the common-base-connected transistor Q3 (neglecting the base currents Iq1b, Iq2b for transistors Q1 and Q2) can be computed as follows: Iq3e=Iq2e+(Iq2e*R1/R2)=Iq2e*(1+R1/R2)=I1*(1+R1/R2).

Accordingly, for a resistor ratio of R1/R2=5, the emitter current Iq3e for transistor Q3 is 6 times the input current I1.

With transistor Q3 configured as a common base amplifier, the output voltage Vout=Vr3 is approximately equal to the product of the collector current Iq3c (which is substantially equal to the emitter current Iq3e) of transistor Q3 and the collector load resistance R3: Vout=Iq3e*(1+R1/R2)*R3=Iq3c*(1+R1/R2)*R3=Ir3*(1+R1/R2)*R3=I1*(1+R1/R2)*R3. (This output voltage Vout is generally further amplified by a buffer amplifier A1 to produce the load voltage Vload.)

One advantage of this circuit is that the input current I1 adds directly to the output current generated by transistor Q1: Iq3c=Iq3e=Iq2c+Iq1e=Iq2e+Iq1e=I1+Iq1e. Since the frequency response of this circuit is dictated primarily by the collector-to-base capacitance Cbcq3 of the output transistor Q3 and the resistance of resistor R1, a high frequency response can be maintained by using a low value of resistance for resistor R1.

Another advantage of this circuit is good temperature compensation due to the matching of the base-emitter diodes of transistors Q1 and Q2.

Figure 3:
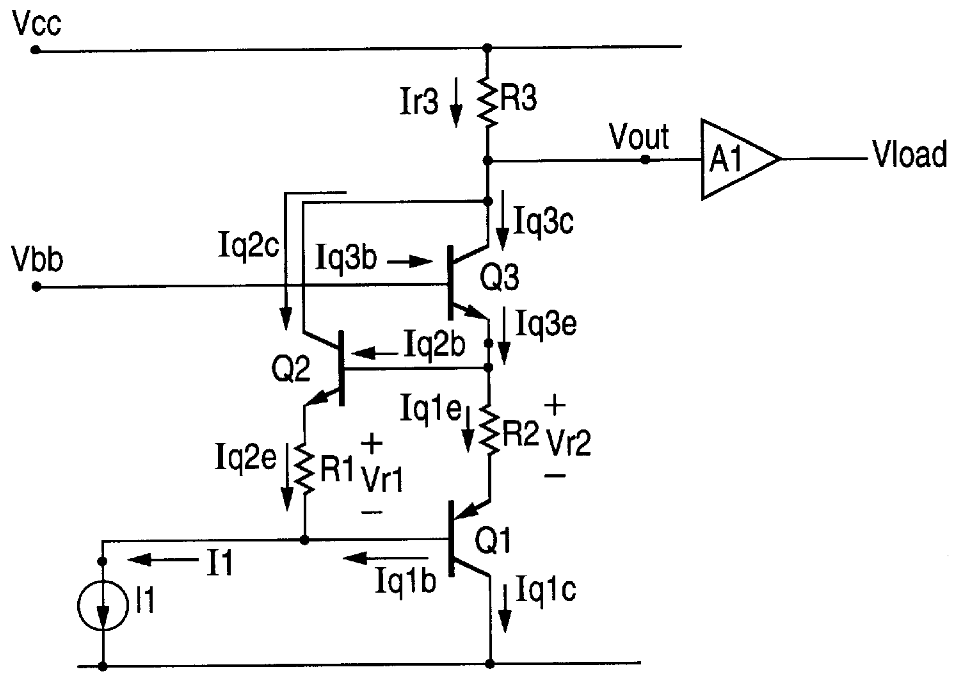
FIG. 3 is a schematic diagram of a current driven amplifier circuit in accordance with another embodiment of the present invention.

Referring to FIG. 3, a current driven amplifier circuit in accordance with another embodiment of the present invention provides for enhanced operation by altering the connection between transistors Q2 and Q3. By connecting the collector of transistor Q2 to the collector of transistor Q3, the current Iq3c through output transistor Q3 is now reduced by an amount equal to the input current I1: Iq3c=Iq3e=I1*R1/R2. As before, the collector current Iq2c of transistor Q2 sums with the collector current Iq3c of transistor Q3, thereby maintaining the same load current Ir3 through resistor R3 while reducing the peak collector current Iq3c through transistor Q3 by an amount equal to the input current I1. This allows the output transistor Q3 to be physically smaller when using the same peak current density design rules as for the circuit of FIG. 2. Hence, this circuit configuration of FIG. 3 may be more effective than the circuit configuration of FIG. 2 if a smaller and lower cost output transistor Q3 is important.

Figure 4:
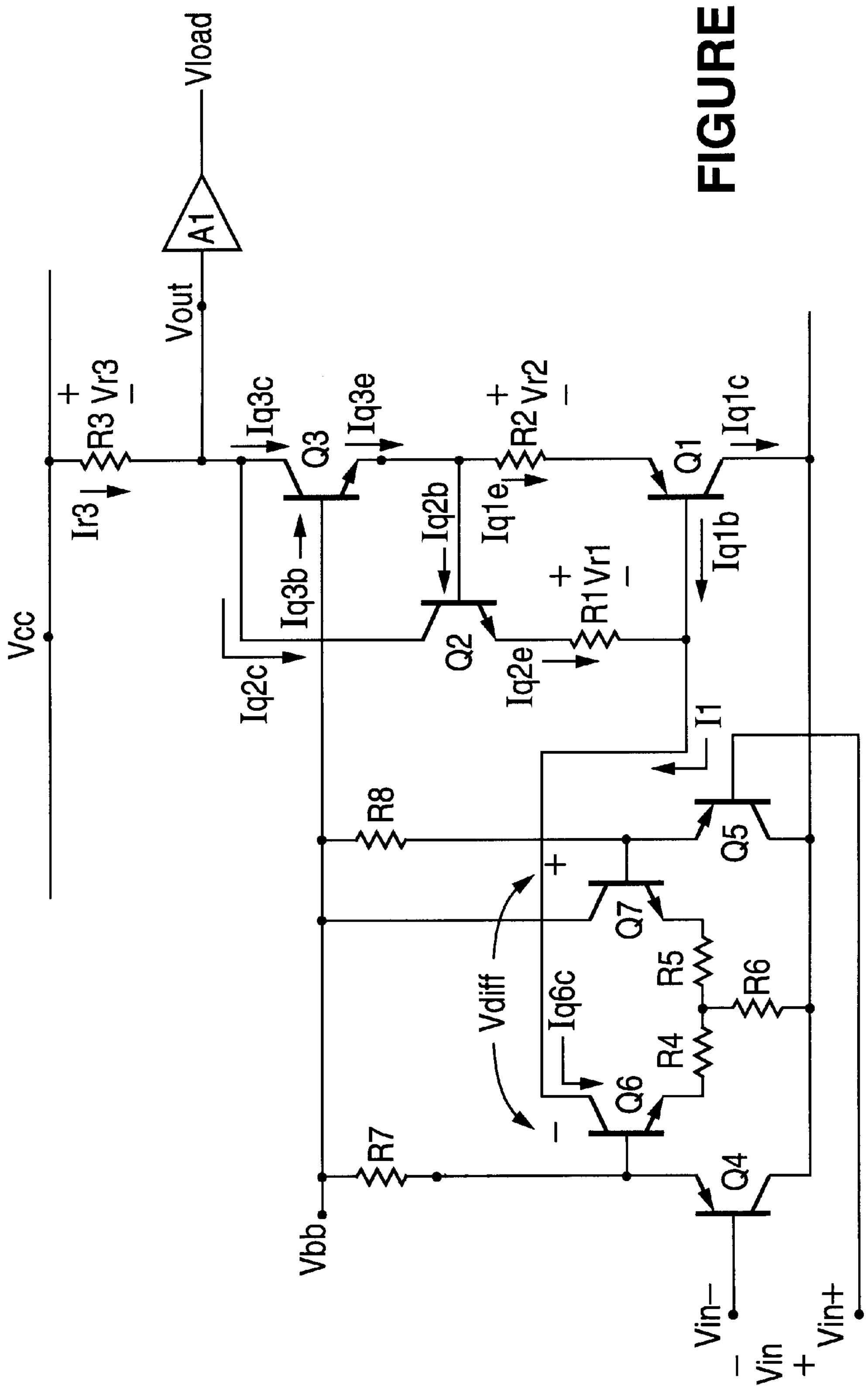
FIG. 4 is a schematic diagram of a current driven amplifier circuit in accordance with still another embodiment of the present invention.

Referring to FIG. 4, the current source I1 circuit can be implemented using a differential amplifier circuit as shown. Transistors Q4 and Q5 receive the negative Vin− and positive Vin+ phases, respectively, of the differential input signal Vin and, in turn, provide a differential signal Vdiff to the base terminals of transistors Q6 and Q7. Transistor Q6 provides the input current I1 by sinking current I1 via its collector terminal. The collector current Iq6c of transistor Q6 is proportional to the difference between the input signals Vin+, Vin−. By buffering the input signals Vin+, Vin− with the PNP emitter follower transistors Q5, Q4 to drive the differential pair transistors Q7, Q6, good temperature matching is achieved, thereby providing the input current I1 with good temperature compensation.

Figure 5:
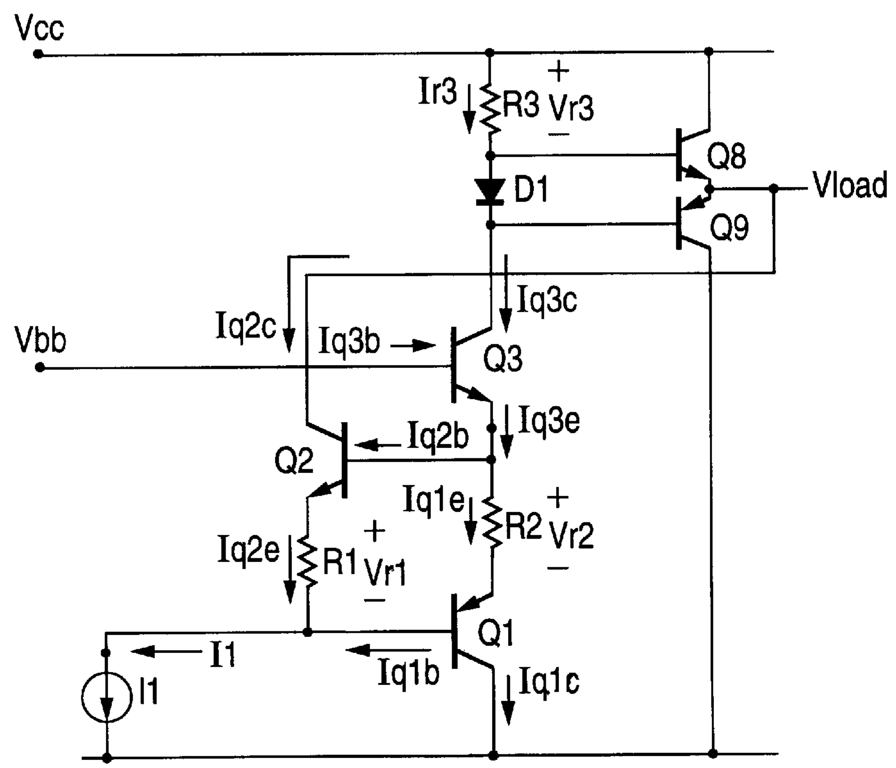
FIG. 5 is a schematic diagram of a current driven amplifier circuit in accordance with yet another embodiment of the present invention.

Referring to FIG. 5, a current driven amplifier circuit in accordance with yet another embodiment of the present invention illustrates how one form of the output buffer amplifier Al can be implemented. Diode D1 and transistors Q8 and Q9 are inserted into the collector circuit of transistor Q3 to provide buffering of the output signal and the load voltage Vload. Additionally, the collector of transistor Q2 is connected to the output terminal at the emitter terminals of transistors Q8 and Q9 to provide further buffering between the output current Iq3c generated by output transistor Q3 and the input current I1 (I1=Iq2e=Iq2c).

As before, this means that the input current I1 sums with the output current made available to the load via transistors Q8 and Q9, while allowing a reduced current to flow through transistor Q3.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a current driven amplifier, comprising:

an amplifier input terminal for conveying an amplifier input current;

an amplifier output terminal for conveying an amplifier output current which is a multiple of said amplifier input current;

a first voltage follower amplifier circuit, with a first bias terminal, a first input terminal coupled to said amplifier input terminal, and a first output terminal coupled to said amplifier output terminal, that provides a first portion of said amplifier output current; and a second voltage follower amplifier circuit, with a second bias terminal, a second input terminal coupled to said amplifier output terminal, and a second output terminal coupled to said amplifier input terminal, that receives a portion of said amplifier input current and provides a second portion of said amplifier output current.

2. The apparatus of claim 1, wherein:

said first voltage follower amplifier circuit comprises a first emitter follower circuit; and said second voltage follower amplifier circuit comprises a second emitter follower circuit.

3. An apparatus including a current driven amplifier, comprising:

an amplifier input terminal for conveying an amplifier input current;

an amplifier output terminal for conveying an amplifier output current which is a multiple of said amplifier input current;

a first voltage follower amplifier circuit, with a first bias terminal, a first input terminal coupled to said amplifier input terminal, and a first output terminal coupled to said amplifier output terminal, that provides a first portion of said amplifier output current; and a second voltage follower amplifier circuit, with a second bias terminal, a second input terminal coupled to said amplifier output terminal, and a second output terminal coupled to said amplifier input terminal, that receives a portion of said amplifier input current and provides a second portion of said amplifier output current;

wherein said first voltage follower amplifier circuit is primarily of a first semiconductor conductivity type, and said second voltage follower amplifier circuit is primarily of a second semiconductor conductivity type which is opposite to said first semiconductor conductivity type.

4. The apparatus of claim 3, wherein:

said first voltage follower amplifier circuit comprises a first emitter follower circuit; and said second voltage follower amplifier circuit comprises a second emitter follower circuit.

5. The apparatus of claim 1, wherein said second bias terminal and said second input terminal are coupled together.

6. The apparatus of claim 1, further comprising an output amplifier circuit, coupled to said first and second voltage follower amplifier circuits, that receives said first and second portions of said amplifier output current.

7. An apparatus including a current driven amplifier, comprising:

an amplifier input terminal for conveying an amplifier input current;

an amplifier output terminal for conveying an amplifier output current which is a multiple of said amplifier input current;

a first voltage follower amplifier circuit, with a first bias terminal, a first input terminal coupled to said amplifier input terminal, and a first output terminal coupled to said amplifier output terminal, that provides a first portion of said amplifier output current;

a second voltage follower amplifier circuit, with a second bias terminal, a second input terminal coupled to said amplifier output terminal, and a second output terminal coupled to said amplifier input terminal, that receives a portion of said amplifier input current and provides a second portion of said amplifier output current; and an output amplifier circuit, coupled to said first and second voltage follower amplifier circuits, that receives said first and second portions of said amplifier output current;

wherein said output amplifier circuit comprises a common base amplifier circuit.

8. An apparatus including a current driven amplifier, comprising:

an amplifier input terminal for conveying an amplifier input current;

an amplifier output terminal for conveying an amplifier output current which is a multiple of said amplifier input current;

a first voltage follower amplifier circuit, with a first bias terminal, a first input terminal coupled to said amplifier input terminal, and a first output terminal coupled to said amplifier output terminal, that provides a first portion of said amplifier output current;

a second voltage follower amplifier circuit, with a second bias terminal, a second input terminal coupled to said amplifier output terminal, and a second output terminal coupled to said amplifier input terminal, that receives a portion of said amplifier input current and provides a second portion of said amplifier output current; and an output amplifier circuit, coupled between said first bias terminal and said amplifier output terminal, that receives said first portion of said amplifier output current.

9. The apparatus of claim 8, wherein said output amplifier circuit comprises a common base amplifier circuit.

10. The apparatus of claim 1, wherein:

said first voltage follower amplifier circuit includes a first resistive circuit element having a first resistance value;

said second voltage follower amplifier circuit includes a second resistive circuit element having a second resistance value; and said multiple of said amplifier input current is defined by a ratio of said first and second resistance values.

11. The apparatus of claim 1, further comprising an input amplifier circuit, coupled to said first and second voltage follower amplifier circuits, that following reception of an input voltage signal provides said amplifier input current.

12. An apparatus including a current driven amplifier, comprising:

an input terminal for conveying an input current;

an output terminal for conveying an output current which is a multiple of said input current;

a first transistor with a first base terminal coupled to said input terminal, a first emitter terminal and a first collector terminal;

a second transistor with a second base terminal coupled to said output terminal, a second emitter terminal and a second collector terminal;

a first resistor coupled between said first emitter terminal and said output terminal; and a second resistor coupled between said second emitter terminal and said input terminal.

13. The apparatus of claim 12, wherein said second collector terminal is coupled to said output terminal.

14. The apparatus of claim 12, further comprising a third transistor with a third base terminal, a third emitter terminal coupled to said output terminal, and a third collector terminal.

15. The apparatus of claim 14, further comprising an output amplifier circuit with an amplifier input terminal coupled to said third collector terminal and an amplifier output terminal coupled to said second collector terminal.

16. The apparatus of claim 12, further comprising a third transistor with a third base terminal, a third emitter terminal coupled to said output terminal, and a third collector terminal coupled to said second collector terminal.

17. The apparatus of claim 12, further comprising an input amplifier circuit, coupled to said input terminal, that following reception of an input voltage signal generates said input current.

* * * * *